(12) United States Patent
Holtermann et al.

(10) Patent No.: US 8,278,220 B2
(45) Date of Patent: Oct. 2, 2012

(54) METHOD TO DIRECT PATTERN METALS ON A SUBSTRATE

(75) Inventors: Theresa Holtermann, Hillsboro, OR (US); Anthony Graupera, Hillsboro, OR (US); Michael Dibattista, Portland, OR (US)

(73) Assignee: FEI Company, Hillsboro, OR (US)

( * ) Notice: Subject to any disclaimer, the term of this patent is extended or adjusted under 35 U.S.C. 154(b) by 1052 days.

(21) Appl. No.: 12/210,781

(22) Filed: Sep. 15, 2008

(65) Prior Publication Data

US 2010/0032302 A1 Feb. 11, 2010

Related U.S. Application Data

(60) Provisional application No. 61/087,605, filed on Aug. 8, 2008.

(51) Int. Cl.
*H01L 21/311* (2006.01)

(52) U.S. Cl. ........ 438/694; 438/689; 438/690; 438/700; 438/759; 430/4; 430/5; 250/492.1; 250/492.2; 250/492.21; 250/492.3; 257/E21.585; 257/E21.586

(58) Field of Classification Search ................. None
See application file for complete search history.

(56) References Cited

U.S. PATENT DOCUMENTS

| 3,013,955 A | | 12/1961 | Roberts |
| 3,043,955 A | | 7/1962 | Friedland et al. |
| 3,506,545 A | * | 4/1970 | Nowick et al. ............... 205/125 |
| 4,641,034 A | * | 2/1987 | Okamura et al. .......... 250/492.2 |
| 4,874,460 A | | 10/1989 | Nakagawa et al. |
| 4,925,755 A | * | 5/1990 | Yamaguchi et al. .............. 430/5 |
| 5,976,980 A | | 11/1999 | Livengood et al. |
| 6,153,891 A | | 11/2000 | Livengood |
| 6,319,831 B1 | | 11/2001 | Tsai et al. |
| 6,372,529 B1 | | 4/2002 | Ring et al. |

(Continued)

FOREIGN PATENT DOCUMENTS

GB 1062365 3/1967

OTHER PUBLICATIONS

Guckel, H., Proceeding of the IEEE, vol. 86, 1998, pp. 1586-1593.*

(Continued)

*Primary Examiner* — Lan Vinh
*Assistant Examiner* — Jiong-Ping Lu
(74) *Attorney, Agent, or Firm* — Scheinberg & Associates, PC; Michael O. Scheinberg; Robert J. Amedeo

(57) ABSTRACT

A microscopic metallic structure is produced by creating or exposing a patterned region of increased conductivity and then forming a conductor on the region using electrodeposition. In some embodiments, a microscopic metallic structure is formed on a substrate, and then the substrate is etched to remove the structure from the substrate. In some embodiments, a focused beam of gallium ion without a deposition precursor gas scans a pattern on a silicon substrate, to produce a conductive pattern on which a copper structure is then formed by electrochemical deposition of one or more metals. The structure can be freed from the substrate by etching, or can used in place. A beam can be used to access an active layer of a transistor, and then a conductor can be electrodeposited to provide a lead for sensing or modifying the transistor operation while it is functioning.

20 Claims, 8 Drawing Sheets

U.S. PATENT DOCUMENTS

| | | |
|---|---|---|
| 6,720,248 B2 | 4/2004 | Ryo |
| 6,838,380 B2 | 1/2005 | Bassom et al. |
| 6,913,681 B2 | 7/2005 | Matsuda et al. |
| 6,923,892 B2 | 8/2005 | Tatsuura et al. |
| 6,974,768 B1 | 12/2005 | Kailasam |
| 7,514,353 B2 | 4/2009 | Weidman et al. |
| 2003/0045110 A1* | 3/2003 | Yang et al. ............ 438/700 |
| 2005/0227484 A1* | 10/2005 | Gu et al. ............ 438/667 |
| 2008/0088831 A1 | 4/2008 | Mulders et al. |
| 2010/0151679 A1 | 6/2010 | Gu et al. |

OTHER PUBLICATIONS

P. Schmuki et.al., Journal of the Electrochemical Society, vol. 148, 2001, pp. C177-C182.*

Andricacos, P.C., et al., 'Damascene Copper Electroplating for Chip Interconnections,' IBM Journal of Res. Develop, Sep. 1998, pp. 567-574, vol. 42, No. 5.

Circuit Technology Center, Guidebook—A Comprehensive Resource for Circuit Board Rework and Repair, revised Jul. 7, 2000, www.circuittechctr.com/guides/4-6-3.stml (8 pages).

Lee, R., et al., 'FIB Micro-Surgery on Flip-Chips From the Backside,' Proceedings from the 24th International Symposium for Testing and Failure Analysis, Nov. 15-19, 1998, pp. 455-459.

Schlangen, R., et al., 'Contact to Contacts or Silicide by Use of Backside FIB Circuit Edit Allowing to Approach Every Active Circuit Node,' Microelectronics Reliability, 2006, pp. 1498-1503.

Paniccia, et al, "Novel Optical Probing and Micromachining Techniques for Silicon Debug of Flip Chip Packaged Microprocessors," Microelectronics Engineering, 1999, pp. 27-34, vol. 46.

Kerst, et al, "Contacting Diffusion with FIB for Backside Circuit Edit- Procedures and Material Analysis," Proceedings of the 31st International Symposium for Testing and Failure Analysis, 2005, pp. 64-69, Santa Clara, CA, USA.

Boit, Christian, "New physical techniques for IC functional analysis of on-chip devices and interconnects," Science Direct-Applied Surface Science, 2005, pp. 18-23, vol. 252.

* cited by examiner

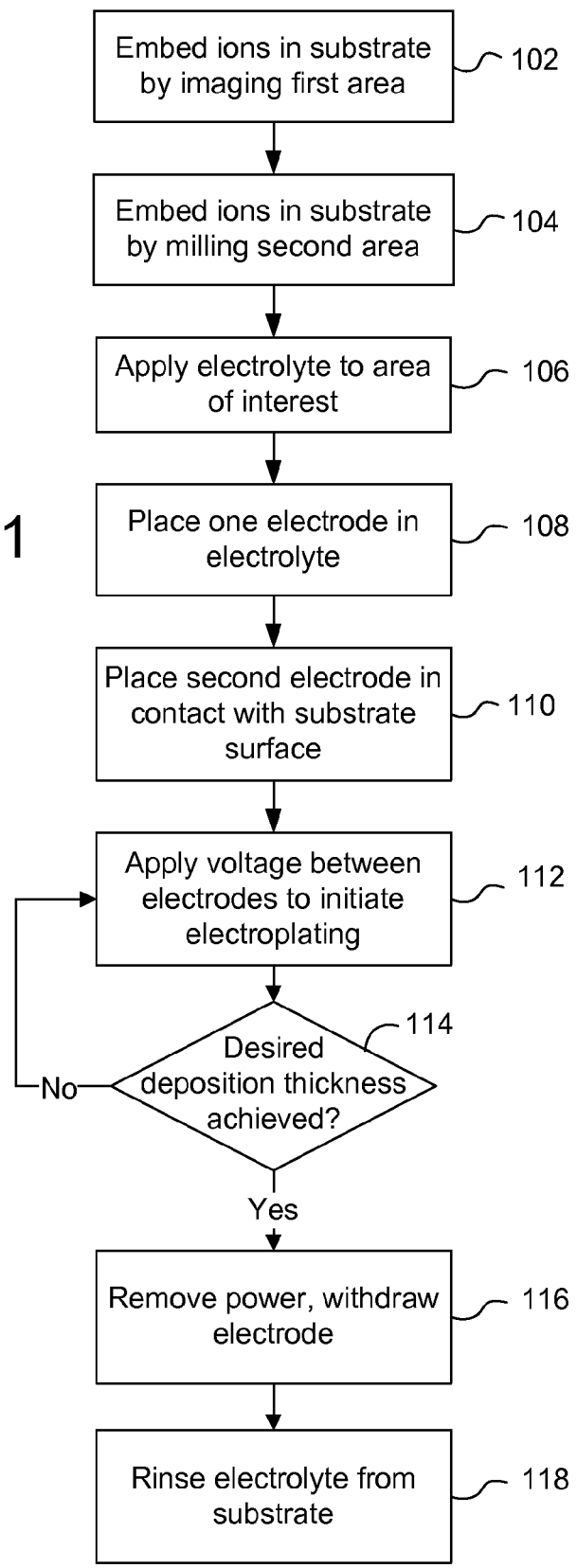

METHOD TO DIRECT PATTERN METALS ON A SUBSTRATE

TECHNICAL FIELD OF THE INVENTION

The present invention relates to nanotechnology fabrication and semiconductor testing.

BACKGROUND OF THE INVENTION

Microscopic mechanical and electrical devices of various sizes are used in a wide variety of applications. Continual shrinking of the size of integrated circuit (IC) elements demands a corresponding scaling of the processes and structures needed for the design, construction, and testing of scaled-down computer components. Related to the miniaturization of IC chips is the fabrication of microassemblies for use in MEMS (Microelectromechanical systems). MEMS are frequently fabricated on semiconductor substrates using processes similar to those used for IC fabrication.

Producing microscopic metallic structures can be difficult and expensive. One known technique for forming high aspect ratio metallic structures is referred to as "LIGA," a German acronym for (X-ray) lithography (Lithographie), Electroplating (Galvanoformung), and Molding (Abformung). In a typical LIGA process, an X-ray sensitive photoresist material is deposited onto an electrically conductive substrate and exposed to highly collimated X-rays through a patterned mask. The areas that are exposed to the X-rays are chemically modified by the X-rays and can be dissolved in a developer, leaving patterns in the resist material corresponding to the area not exposed to the X-rays. The spaces in the pattern are filled by electrodeposition of a metal. The remaining resist is then removed, and the metallic pattern is used as a mold for injection molding to produce ceramic or polymer micro-parts. The LIGA process can also be used to make sacrificial plastic molds for the fabrication of metal micro-parts. The LIGA process requires the use of highly collimated X-rays, typically from a cyclotron, which makes the process expensive.

Another process for depositing a metallic conductive track on a substrate is ion beam-induced deposition ("IBID"), in which a precursor gas adsorbs onto a substrate surface and decomposes in the presence of the ion beam to deposit a metal on the substrate. Volatile products of the decomposition are removed by the system vacuum pump. Ion beam-induced deposition is used, for example, in the field of "circuit edit," in which an integrated circuit, typically a prototype, is modified to add or remove electrical connections. The precursor gas can be a metal-organic compound, such as tungsten hexacarbonyl (W(CO)$_6$). The energy for the deposition is thought to be transferred to the adsorbed precursor by lattice vibrations. Thus, not only will precursors at the beam impact point decompose to deposit material, but precursor molecules sufficiently close to the beam impact to be affected by the lattice vibration will also decompose. The primary ion beam also causes the emission of secondary particles, which can also cause deposition away from the impact point of the ion beam. Thus, even with a tightly focused beam, the minimum size of the deposited feature is still limited.

U.S. Pat. Pub. No. 20050227484 of Gu et al. for "System for modifying small structure," which is assigned to the assignee of the present invention, teaches using ion beam-induced deposition to provide a conductive layer, and then electrodepositing another conductive layer on top of the ion beam-induced deposition ("IBID") layer. The electrodeposited layer typically has better conductivity than the IBID layer. The electrodeposited layer, however, is at least as wide as the IBID layer. Thus, the combination of IBID and electrodeposition has at least the same feature size limitation as IBID.

Another difficulty caused by the miniaturization is the difficulty in testing circuits. Integrated circuits are often mounted into a package using a technique called "Controlled Collapse Chip Connection" or "C4." The integrated circuit is mounted "upside down" on a substrate, with electrical connectors from the chip making contact with mating contacts on the package substrate. Such chips are therefore also referred to "flip chips." To test such chips after they are mounted requires removing much of the silicon from the back of the chip to get close to the active circuit elements.

One method of determining the signal in a circuit element, such as a transistor, entails shining a laser upon the circuit element, and observing the effect of the current on the reflected light. Such a technique is described, for example, in "Novel Optical Probing and Micromachining Techniques for Silicon Debug of Flip Chip Packaged Microprocessors," Paniccia et al., *Microelectronics Engineering* 46, pp. 27-34 (1999). As circuits become smaller, however, the laser is unable to focus to a sufficiently small area to determine the effects of a single transistor. Infrared laser-based tools are failing to scale due to wavelength limitations—the laser spot now encompasses multiple transistors in the region, making it difficult to determine the properties of a single transistor.

A proposed method of circuit edit for flip chips is described in "Contacting Diffusion with FIB for Backside Circuit Edit—Procedures and Material Analysis" by Kerst et al. STFA 2005, Santa Clara Calif., USA, *Proceedings of the 31st International Symposium for Testing and Failure Analysis*, pp 64-69 (2005), ("Kerst"). Kerst describes milling a trench from the backside of a wafer to contact either the diffusion region of a transistor or the contacts to the diffusion region using ion beam-induced deposition. The interface between the material deposited by ion beam-induced deposition and the doped semiconductor of the diffusion region produces a Schottky diode, rather than the preferred ohmic contact. Kerst describes a procedure for producing a silicide layer to provide an ohmic contact between a deposited FIB conductor and the doped silicon in the diffusion layer. The process requires heating the contact area, which can damage the integrated circuit.

Thus, there is a requirement for producing smaller metallic structures, both as free standing metal micro-part and as conductors on substrates.

SUMMARY OF THE INVENTION

An object of the invention is to provide a method and apparatus for producing microscopic metallic structures.

In some embodiments of the invention, a microscopic metallic structure is produced by creating or exposing a patterned region of increased conductivity and then forming a conductor on the region using electrodeposition. In some embodiments, a microscopic metallic structure is formed on a substrate, and then the substrate is etched to remove the structure from the substrate.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more through understanding of the present invention, and advantages thereof, reference is now made to the following descriptions taken in conjunction with the accompanying drawings.

FIG. 1 is a flow chart of the steps of the first embodiment of the invention.

FIG. 2 illustrates schematically the different steps of the flowchart of FIG. 1. In particular.

FIG. 5 shows the results of the steps of FIG. 4. In particular.

FIG. 7 shows the results of the steps of FIG. 6. In particular.

DETAILED DESCRIPTION OF PREFERRED EMBODIMENTS

Figure 2A:
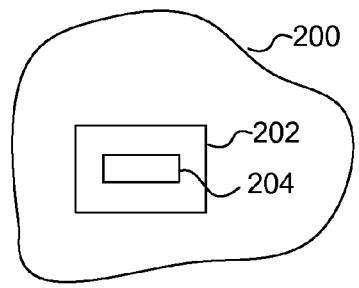
FIG. 2A shows, in a planar view, a small area within a larger area.

In some embodiments of the invention, a metal structure of microscopic dimensions is produced by forming an electrically conductive pattern on a lower conductivity surface and then depositing the metal structure on the conductive pattern using electrodeposition. Electroplating requires a conductive path to supply the electrochemical plating reaction with electrons, and so the shape of the structure is controlled by controlling the shape of a conductive pattern. For example, the conductivity may be increased on a semiconductor surface by scanning a beam of dopant ions to implant dopant atoms in a desired pattern. The dopant ions increase the conductivity of the semiconductor relative to the surface area that was not scanned by the beam. The dopant atoms may also be implanted in a pattern using a photolithography process. The scanned pattern provides a current path to support electrodeposition, while metal is not deposited on regions lacking the implanted ions.

In other embodiments, a conductive pattern is formed by patterning a low conductivity layer on a surface to expose an underlying layer of greater conductivity, the greater or higher conductivity layer having sufficient conductivity to support an electrodeposition reaction and the low conductivity layer having insufficient conductivity to support an electrodeposition reaction. The low conductivity layer may be patterned using a focused beam, such as an ion beam, an electron beam, or a laser, or using photolithography. If an electron beam is used, an etchant, such as $XeF_2$ is used with the electron beam to etch the low conductivity layer. The ion beam need not be composed of ions that will remain dope or even remain in the substrate. For example, helium, oxygen, or argon ions can be used. The low conductivity layer may be, for example, a native oxide or a deposited or grown oxide or nitride layer. After the patterned conductive layer is created or exposed, a metal structure is deposited using electrodeposition.

In other embodiments, microscopic metal structures are created on a substrate, and then freed from the substrate by etching. The metal structures may be made using electrodeposition onto a patterned area, as described above. The metal structures may also be made by IBID without electrodeposition. Individual structures can be created and removed singly, or multiple structures can be made, freed, and collected, for example, using a filter mesh.

In one preferred embodiment, a liquid metal ion source, such as a gallium ion source, provides the ions that are formed into a beam and implanted into a semiconductor silicon substrate. Other particles beams, such as an ion beam from a plasma ion source, can also be used. The implanted ions form a weakly conductive seed layer that is sufficiently conductive to begin an electroplating process. For example, implanted gallium atoms dope the silicon, increasing its conductivity to form a conductive seed layer. Applicants have found that that using an ion beam to create a conductive pattern works well on materials that form native oxides. The beam is thought to damage the surface oxide layer to provide a conductive path to the semi-conductive substrate. In some embodiments, the mechanism for providing a conductive path is thought to be a combination of removing an insulating native oxide layer and doping the substrate. Applicants describe these underlying theoretical mechanisms to assist skilled persons to implement various embodiments of the invention—the invention has been shown empirically to work, and its functionality does not depend on the accuracy of the theoretical mechanism presented herein.

After a seed layer or other conductive pattern is formed, a more highly conductive material is then electrodeposited over this seed layer. The electrodeposited material typically has lower resistivity than the seed layer as well as lower resistivity than a conductor deposited by conventional IBID. The inventive process overcomes the minimum feature size limitation of U.S. Pat. Pub. No. 20050227484 because the conductive pattern is of higher precision than an IBID layer. The present invention provides the ability to microfabricate three-dimensional shapes and objects out of metals such as copper, nickel, chromium, or other conducting material, with electrical properties superior to those created by IBID, because the IBID layer is invariably contaminated with non-metallic elements from the precursor gas and because the contact between the IBID layer and a semiconductor layer is typically non-ohmic, that is, a Schottky barrier is created at the interface.

An ion beam can be scanned in an arbitrary pattern to form thin lines or solid patterns of arbitrary shape. A seed layer could also be applied using a lithography process. For example, a patterned protective coating could be applied to a wafer, and then ions could be added into the substrate for example, by implantation in a plasma chamber or by diffusion, in a pattern defined by areas which are not covered by the protective layer. The ions could dope the substrate or remove an insulating layer in a pattern defined by the absence of the protective layer, so that a sufficiently conductive layer is exposed only in the unprotected areas.

After the seed layer is applied, an electrolyte containing metal ions of the type to be deposited, such as copper in a copper acetate or copper sulfate solution, is dispensed to cover the region containing the patterned seed layer. Depending on the application, the electrolyte can be applied locally on a portion of the substrate, or the entire substrate can be covered or immersed in the electrolyte. For example, a drop of electrolyte can be deposited from a dropper or pipette. One electrode is electrically connected to the substrate and another is placed in the electrolyte. A voltage is applied between the electrodes until the desired thickness of deposition has been achieved by electrodeposition. Applicants have found that the conductivity of the underlying silicon substrate is sufficient in some embodiments to conduct current to the doped region to support the electrochemical deposition, but the substrate surface conductivity is insufficient to cause deposition in the undoped region, perhaps because of a native oxide layer. The seed layer functions as the cathode for the electrochemical reaction, and the electrode in the electrolyte functions as the anode.

For a semiconducting substrate, such as silicon, of an element in the 4$^{th}$ column of the periodic table, the beam preferably includes ions from the group consisting of the 3$^{rd}$ or 5$^{th}$ column of the periodic table, or even the 2$^{nd}$ and 6$^{th}$ columns.

The material to be deposited may be provided by metallic ions initially in the electrolyte solution, or the metallic ions can be constantly replenished from an anode electrode, which can be composed of the material to be deposited. In some embodiments, the anode may be made of a material different than the material to be plated, and the material to be plated is deposited out of the solution. The process can be repeated by selecting different anode and cathode points to modify the distribution of metal plating. The electrolyte can be changed to create layered structures of different materials. In this way, the preferred embodiment of the invention allows the production of a fine, complex, conductive pattern.

FIG. 1 is a flow chart showing the steps of a preferred embodiment of the present invention. A substrate undergoing the processing steps of FIG. 1 is illustrated in FIGS. 2A-2D. In steps 102 and 104, a seed layer is deposited in a desired pattern using a focused ion beam, the beam preferably being generated from a gallium liquid metal ion beam source. The term "focused beam" as used herein also includes a "shaped beam" that produces on the substrate surface a shape, such as a rectangle or oval, different from a Gaussian spot. The operating parameters of the beam will vary with the application, but the beam energy is typically between 1 keV and 50 keV, the current is typically between 1 pA and 1 µA.

Some preferred embodiments use a beam of gallium ions from a liquid metal ion source to implant a seed layer. The energy and current of the ions in the beam can vary. For example, the amount of gallium implanted when the gallium beam is scanned and secondary particles are collected for imaging is relatively light, whereas the amount of gallium implanted when the beam is used to mill the surface is greater, but either an imaging operation or a milling operation can implant a quantity of ions sufficient to produce a conductive seed layer. In some embodiments, the ion beam may be used to mill a depression in the substrate, wherein the depression can later be filled, partly filled, or over filled by electrodeposition. The depth of the gallium implant varies with the energy of the ions in the beam, but is typically limited to a few nanometers. Gallium is a p-type dopant that when implanted into silicon substrate and increases the substrate's conductivity by contribution "holes" as charge carriers.

Figure 2B:
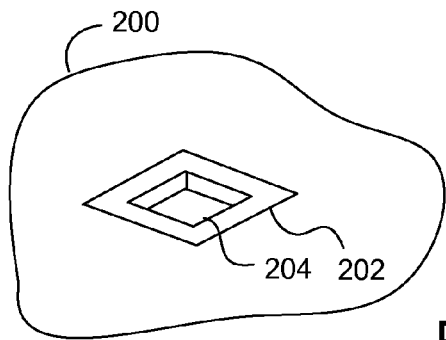
FIG. 2B shows a perspective view of the smaller area milled to form a trench within the larger area.

In step 102, the ion beam is directed to a substrate 200 and scanned over an area 202 of (FIG. 2A) of, for example, about 30 µm by 20 µm. While the beam impinges on the surface of the substrate 200, secondary electrons are collected to form an image. Preferably the beam has an energy of about 30 keV and a beam current of about 2 nA. While a gallium ion beam will invariably remove some material from the substrate 200, the ion energy and dose in step 102 is insufficient to produce a significant trench, but sufficient to provide secondary electrons for imaging. In step 104, the ion beam is scanned over a smaller area 204, approximately 10 µm×10 µm to mill a trench to a depth of about 1,000 nm, as shown in FIG. 2B. When used for milling area 204, the beam preferably has an energy of about 30 keV and a beam current of about 2 nA. By varying the ion dose over different regions, the depth of milling can be varied to create intricate three-dimensional structures. The substrate as etched by the ion beam acts as a mold and the electrodeposited material fills the mold like a casting.

Figure 2C:
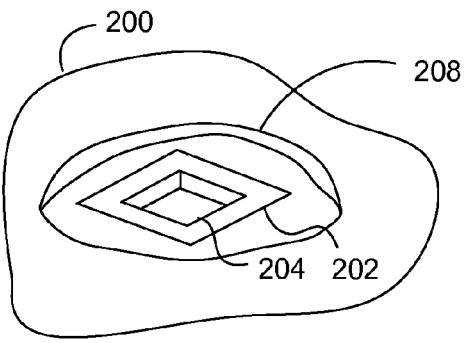
FIG. 2C shows electrolyte being applied to the areas for electroplating.
Figure 2D:
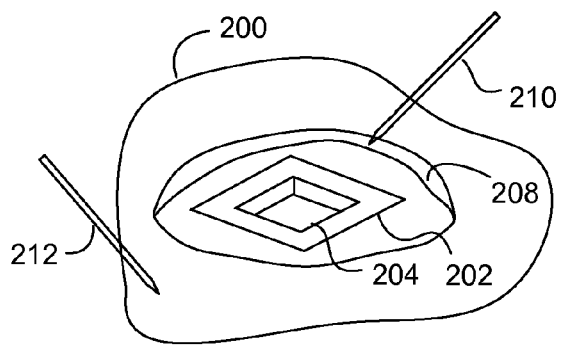
FIG. 2D shows the placement of electrodes for electroplating.
Figure 2E:
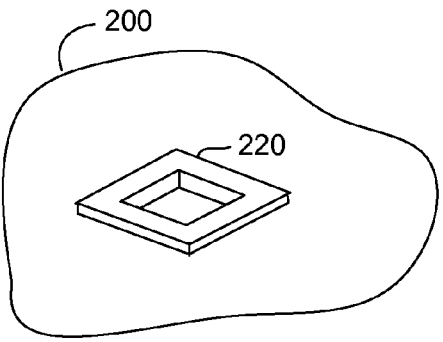
FIG. 2E shows a finished deposited structure separated from the substrate.
Figure 3:
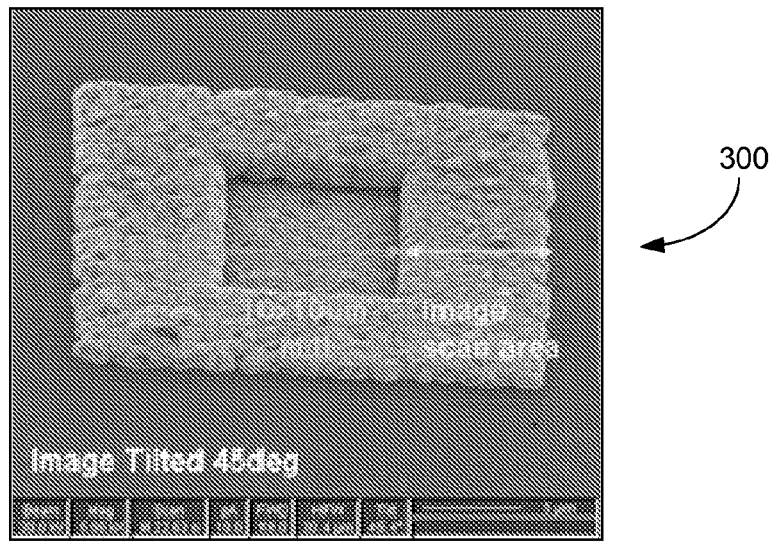
FIG. 3 is a micrograph showing a structure made using the steps of FIG. 1.

In step 106, an electrolyte 208, such as a copper acetate solution, is applied to the cover the area to be electroplated, as shown in FIG. 2C. The electrolyte can be applied locally using a pipette or eyedropper, or the substrate 200 can be immersed in the electrolyte 208. As shown in FIG. D, an electrode 210 is placed in electrolyte 208 in step 108, preferably not touching the surface of the implanted area. Electrode 210 can include, for example, a tungsten needle or a copper wire. In step 110, a second electrode 212 is placed in contact with the substrate surface. Applicants have found that the second electrode 212 can be placed anywhere on the substrate surface to provide a sufficient current path to sustain the electrochemical reaction. In step 112, a voltage is applied between electrode 210 and electrode 212 to initiate the electroplating reaction. In some cases, a constant current source is used, and in some embodiments a constant voltage source is used. In the present example, a constant current of 100 µA is applied with a compliance voltage set to 12 V over two minutes. In one embodiment, a voltage of +12 V is applied to electrode 210, while electrode 212 is grounded. Other test cases have also shown that using a constant voltage will provide the same copper plated results. After the desired thickness of deposition is achieved, as indicated in decision block 114, the voltage across electrode 210 and 212 is removed in step 116 and in step 118, the electrolyte 208 is rinsed from the substrate 200, leaving a deposited structure 220 as shown in FIG. 2E. FIG. 3 is a photomicrograph of an actual structure 300 produced by the process of FIGS. 1 and 2.

Structures fabricated in accordance with the invention can be used on the substrate on which they are made, for example, for adding conductors to an integrated circuit. Structures can also be fabricated on the substrate, and the substrate removed to reveal a free-standing structure. For example, the present invention may be employed to fabricate gears or other mechanical components that can be used as part of a larger MEMS assembly.

Figure 4:
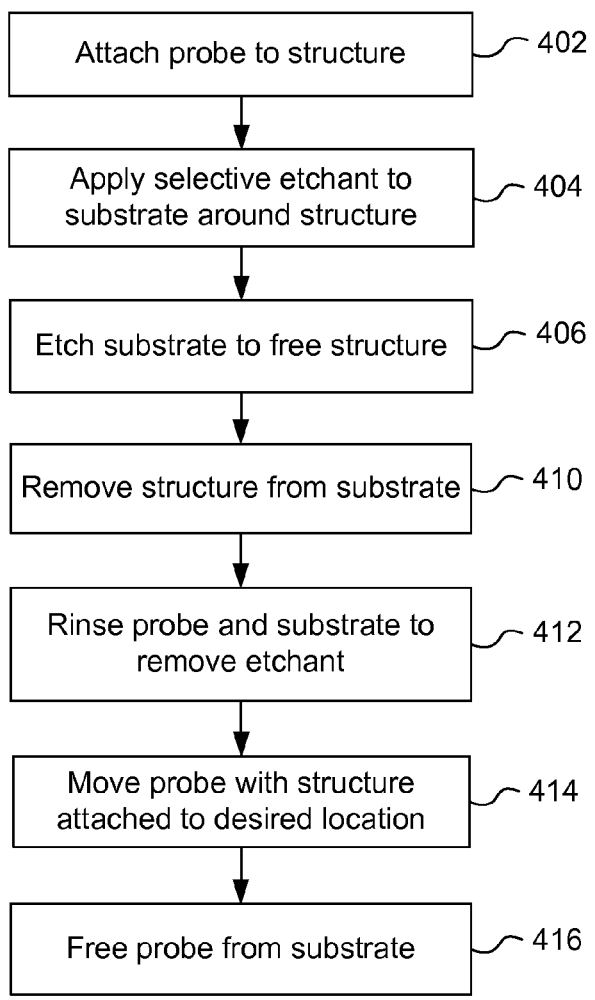
FIG. 4 is a flow chart showing the additional steps for making a free-standing part, such as a MEMS component, in accordance with the invention.
Figure 5A:
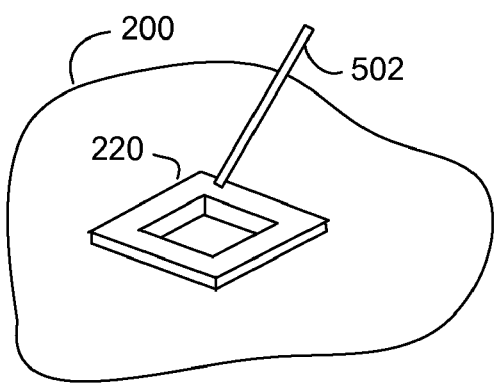
FIG. 5A shows a probe attached to a structure.
Figure 5B:
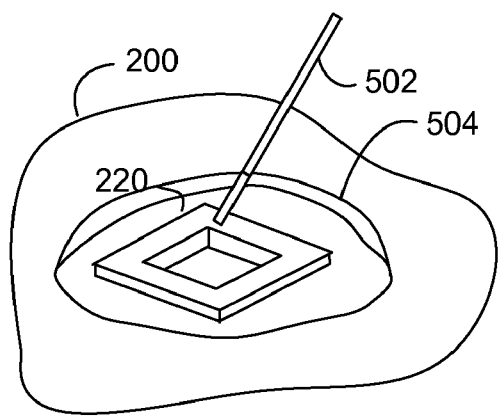
FIG. 5B shows a selective etchant applied over the structure.

FIG. 4 is a flow chart showing the additional steps for making a free-standing part in accordance with the invention, and FIG. 5A-5D shows the results of the steps of FIG. 4. In step 402, a probe 502 is attached to structure 220 as shown in FIG. 5A. The probe 502 can be attached, for example, using an adhesive on the end of probe 502 or using charged particle beam deposition. The probe could include a gripper to grasp the structure or a voltage could be applied to the probe to adhere the structure using static electricity. In step 404, a selective etchant 504, such as xenon difluoride, is dispensed over the structure 220 as shown in FIG. 5B, or at least at the edges of the structure. The selective etchant 504 should be one that etches the substrate 200 much more rapidly than it etches the structure 220, the probe 502 or the material by which the structure 220 is attached to the probe 502. In some embodiments, the etching can be started before the probe is attached, with the probe being attached sometime before the structure is freed. In step 406, the etchant 504 dissolves a portion of the substrate 200 to free the structure 220. By milling a hole in the semiconductor substrate and electroplating from the bottom of the hole, high aspect ratio structures can be formed.

Figure 5C:
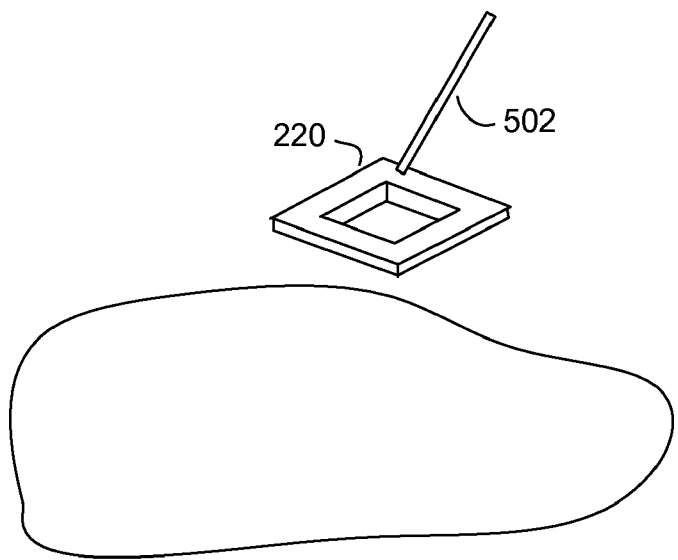
FIG. 5C shows the structure removed from the substrate by the probe.
Figure 5D:
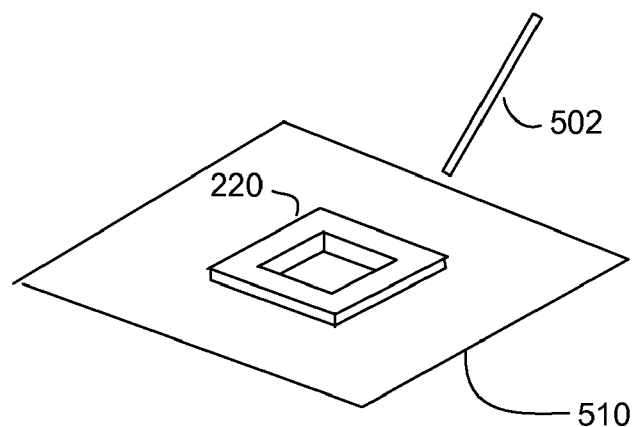
FIG. 5D shows the structure placed on a different substrate, with the probe freed from the structure.

In step 410, the structure 220 is removed from the substrate 200 as shown in FIG. 5C by moving the probe 502 and in optional step 412, the structure 220 and the probe 502 are rinsed to remove or neutralize the etchant 504. In step 414, the structure 220 is moved using the probe 502 to position the structure 220 in a desired location, such as onto a holder or onto another substrate 510, as shown in FIG. 5D, where the structure 220 will be used. In step 416, and also as shown in FIG. 5D, the structure 220 is freed from the probe 502, for example, by dissolving the adhesive or by using focused ion beam milling.

In some embodiments, multiple structures can be fabricated at the same time, using steps 102 to 118, and then the surface of substrate 200 can be covered in an etchant or the substrate 200 can be immersed in an etchant to free multiple, and floating away multiple ones of structure 220. The structure 220 can be captured in a mesh filter or using other known techniques. While the procedure of FIG. 4 starts where the procedure of FIG. 1 left off, the process of FIG. 4 could be performed regardless of how the initial structure was produced. For example, the structure could be produced by depositing a conductor using IBID and then electroplating the structure onto the IBID layer, as described in U.S. Pat. Pub. No. 20050227484. For example, an IBID layer of tungsten could be deposited using tungsten hexacarbonyl, and then copper can be electroplated over the IBID tungsten layer. A selective etchant, such as xenon difluoride, will selectively etch the tungsten with minimal effect of the copper, effectively severing the copper structure from the substrate by dissolving the tungsten layer. The structure can then be separated from the substrate and transported to another located for use, for example, using a probe to move individual structures or using a filter mesh to capture a small or large number of structures.

The method described above can be used to create structures having dimensions measured in microns, particularly, less than 100 μm, less than 50 μm, less than 10 μm or less than 1 μm. Complex three dimensional shapes can be fabricated by first milling a three dimensional "mold" in the substrate using the ion beam. The mold can be filed in multiple stages using different electrolytes to deposit different metals. The deposited metal can be sculpted using the ion beam, both between depositions and to form the final product after all electrodeposition is complete.

When implanting the gallium ions, it is preferable that the ion beam not be used to form images for the initial positioning because the use of the ion beam for imaging can implant sufficient gallium to produce a conductive area that will be plated. It is preferable to use a "dual beam" system, including an ion beam and an electron beam. The electron beam can be used for initial imaging and positioning to avoid exposing areas of the substrate to the ion beam.

While the embodiments above describe the use of gallium as a dopant to create a seed layer, any dopant that locally increases the conductivity of the substrate can be used. For example, lithium or aluminum can be used to dope silicon. The characteristics of the underlying substrate should be considered in determining the dopant. For example, in an n-type substrate, a small quantity of p-type dopant will reduce conductivity, although a larger quantity of p-type dopant could change the local region to a p-type semiconductor and increase its conductivity. As described above, in some embodiments, the beam is used to remove an insulating layer, such as a native oxide layer to create a conductive pattern. In some embodiments, a conductive substrate can be coated with an insulating layer such as by oxidation of the surface or by deposition of an insulating material, and then the insulating later is patterned. In such embodiments, it is not necessary that the beam constituents dope the substrate. For example, a helium ion beam, an electron beam with a suitable etchant, or a laser beam can be used to selectively remove the insulating layer to provide a conductive pattern for electroplating. Any electrolyte can be used. For example, copper sulfate, nickel sulfate, or palladium sulfate are useful.

Figure 6:
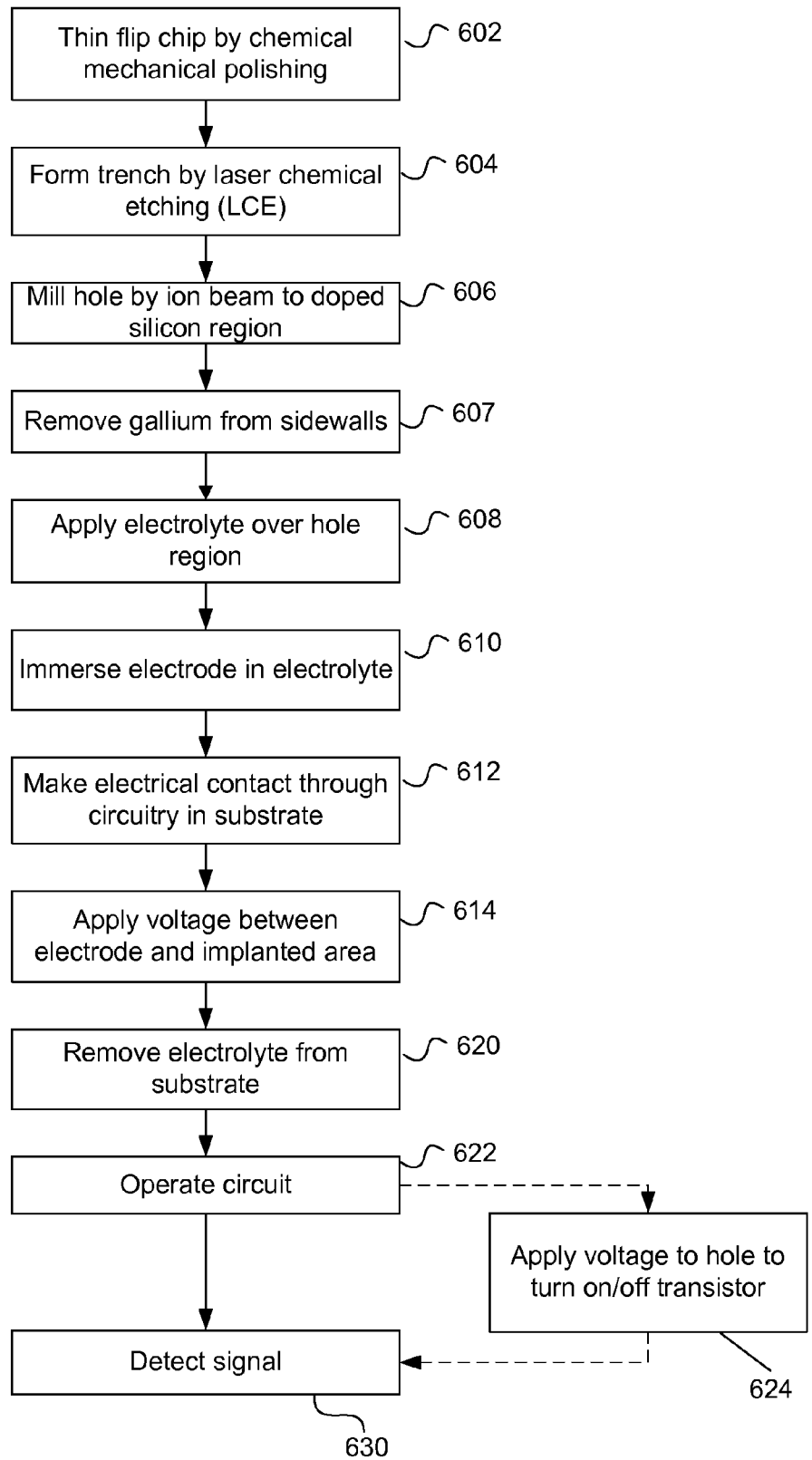
FIG. 6 shows the steps involved in another embodiment of the present invention for creating electrical connections to an electrical component from the backside of a chip.
Figure 7A:
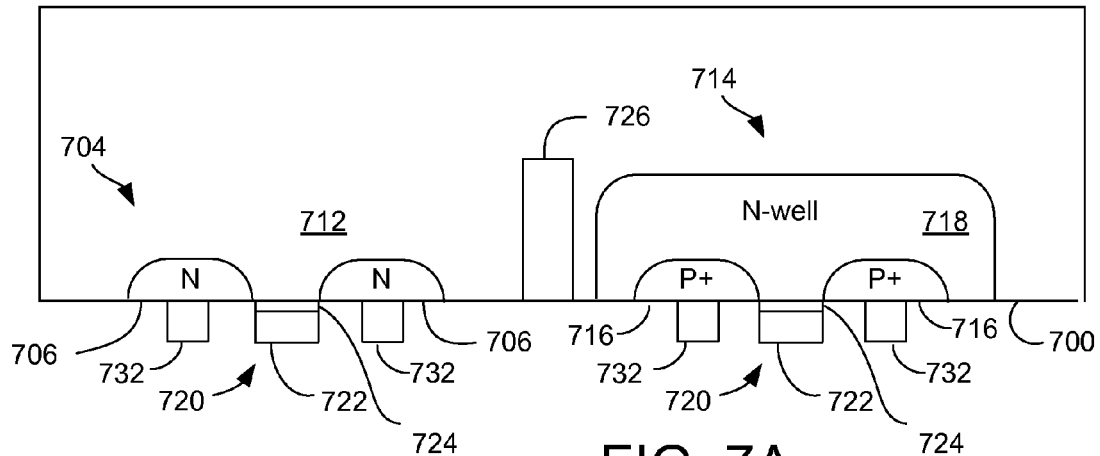
FIG. 7A shows a thinned substrate of a flip chip.

FIG. 6 is a flow chart showing the preferred steps of a method of measuring the properties of a transistor. FIGS. 7A-7E show the results of the steps of the process shown in FIG. 6. In step 602, a flip chip is thinned by chemical-mechanical polishing, typically to a thickness of between 50 and 100 μm. FIG. 7A shows a thinned substrate 700 of a flip-chip with a CMOS transistor 702 (not to scale) comprising two complementary metal oxide semiconductor field effect transistors ("MOSFETS"), a P-channel MOSFET 704 comprising two N regions 706 within a P-type substrate region 712, and a complementary N-channel MOSFET 714 having P+ regions 716 within a N well region 718. The heavily doped P+ regions 716 and N regions 706 are referred to as the active regions or the diffusion regions of the transistor 702. Gates 720 comprise a metal contact 722 over an insulating layer 724. P-channel MOSFET 704 and n-channel MOSFET 714 are separated by a shallow trench 726 of an insulating material, such as silicon dioxide.

Figure 7B:
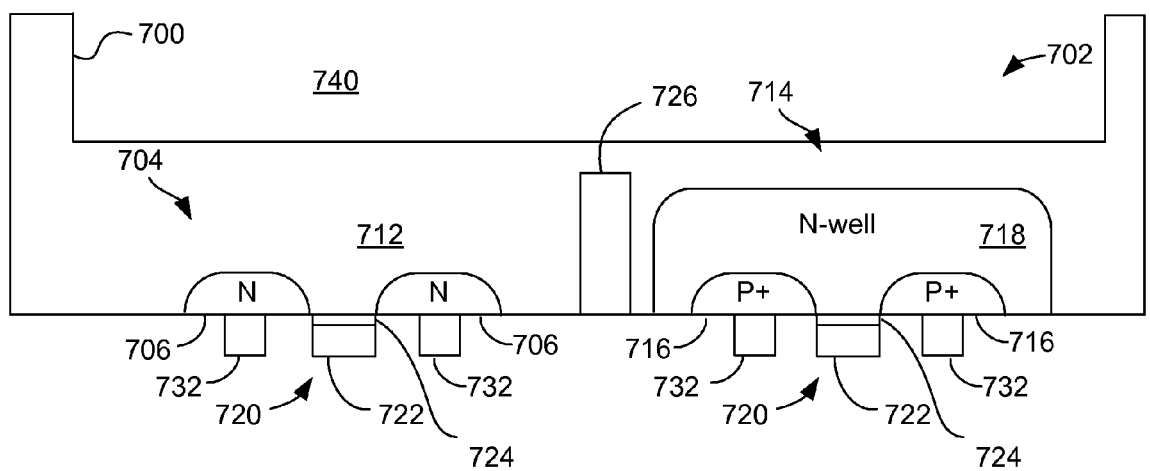
FIG. 7B shows a trench etched over the active region of the transistor.
Figure 7C:
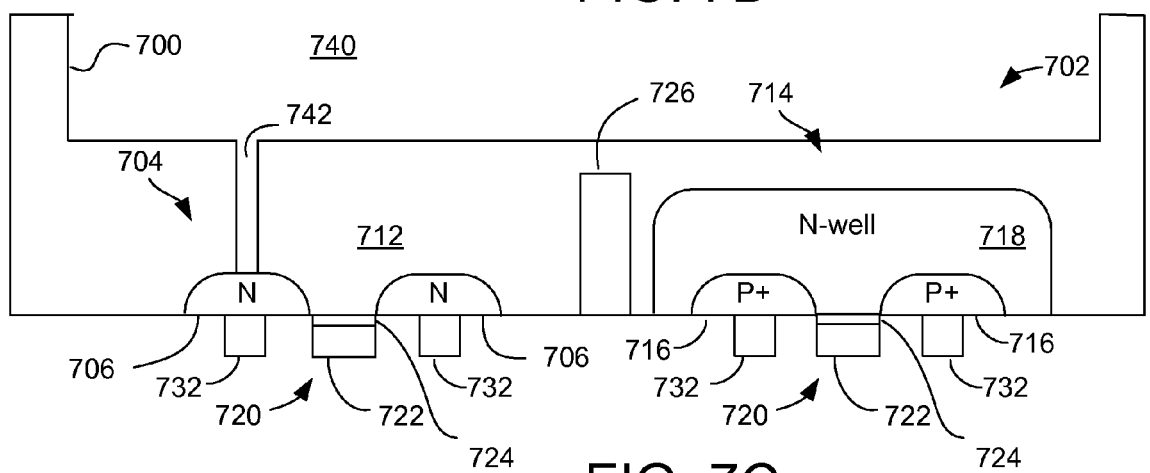
FIG. 7C shows a hole milled to the active diffusion layer of the transistor.

Transistor 704 also includes metal or polysilicon contacts 732 to provide electrical access to the active regions. In step 604, additional substrate material is removed to form a trench 740 over the region containing a feature of interest by laser chemical etching, until about 10 μm remains over the active region of transistor 702, as shown in FIG. 7B. In step 606, an ion beam is used to mill a hole 742 down to n-region 706, as shown in FIG. 7C. The ion beam milling is preferably performed using an etch-assisting gas, preferably a halogen, such as chlorine, iodine or bromine. The gas reduces the redeposition of sputtered material onto the sidewalls of the hole 742. When milling with the FIB to reach the active layer, that is, one of N-regions 706 or P+ regions 716, the FIB operator can determine when the active layer is reached by detecting the change in material, as indicated by a change in the secondary electron current. The conductivity of an active region is greater than that of the substrate region 712 or the n-well 718, so there is a noticeable change in contrast of the FIB SIM image. The change in contrast can be observed by the FIB operator or detected automatically to determine when the active region is reached and milling should cease.

In step 607, gallium that has been scattered onto the side walls of hole 742 is removed using a gas etchant, such as chlorine, bromine, or iodine, or using a wet etchant. Removing gallium implanted from the side walls ensures that the electrodeposition will occur from the bottom of the holes, and there is less likely to be voids in the deposited metal. Gallium implanted in the bottom of the hole may also be removed by the etchant, but the conductivity of the active region is sufficient to provide current for electrodeposition.

Figure 7D:
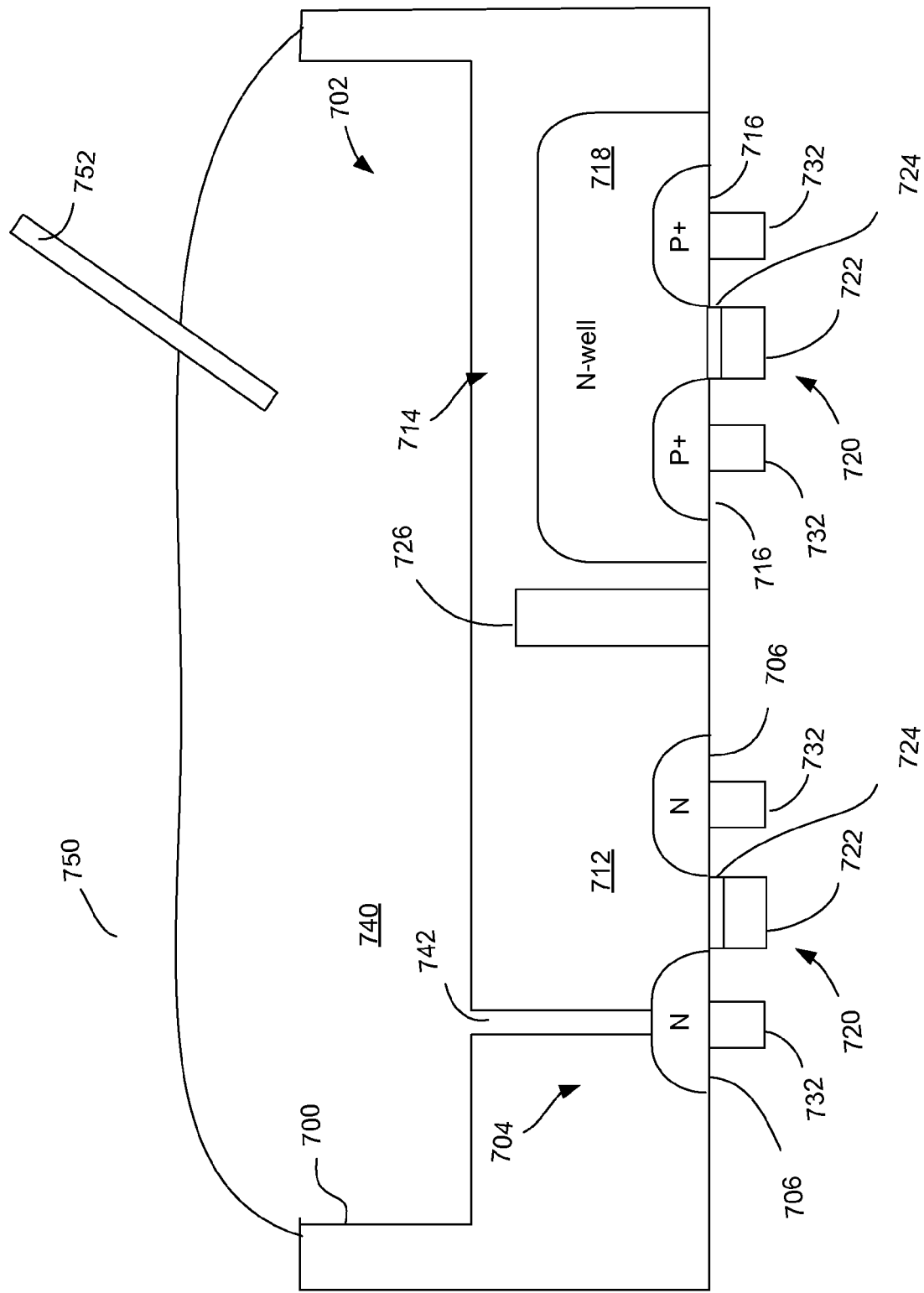
FIG. 7D shows an electrolyte applied over the region including the milled hole.

In step 608, an electrolyte 750 is applied over the region including the hole 742 as shown in FIG. 7D. In step 610, the tip of an electrode 752 is immersed in the electrolyte 750, preferably not touching the substrate 700, and in step 612, a second electrode (not shown) makes electrical contact from the package lead through the circuit metal layers to conductor 732. In step 614, a voltage is applied between electrode 750 and the second electrode to deposit a metallic material 756 from the electrolyte into the hole 742. The electrolyte 750 may be, for example, a solution of copper acetate, copper sulfate, nickel sulfate, chrome, palladium, etc. It will be understood that come materials, such as copper, diffuse quickly in silicon and reduce its conductivity, and the material used is one that preferably has minimal effect on the operation of the transistor.

Figure 7E:
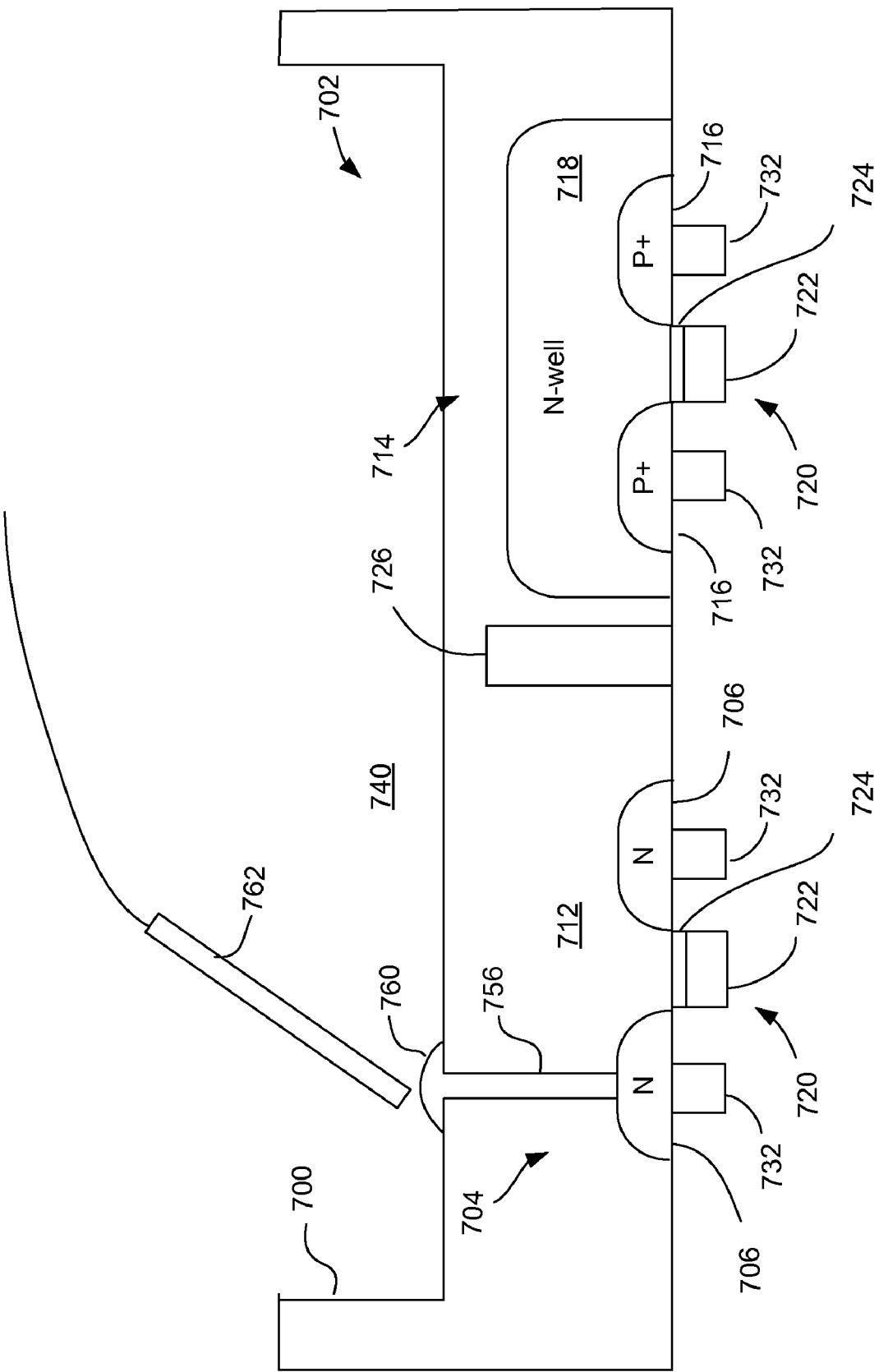
FIG. 7E shows metallic material as electrodeposited into the hole.

The n-region 706 is sufficiently conductivity to provide a current path so that when a voltage is applied between electrode 750 and metal contact 732, a metallic material 756 is electrodeposited into the hole 742, which fills it as shown in FIG. 7E. The hole 742 can be overfilled to create a cap 760 structure at the top of the hole 742 to create a contact for accessing the n-region 704 of transistor 704. In step 620, the electrolyte 750 is removed from the substrate 700. The deposited material 756 provides a low resistivity contact with n-region 706, without requiring a heating step to create a silicide, although such a heating step could be performed to alter the contact characteristics.

In step 622, the circuit is operated, while detecting a signal in step 630 using a probe 762 (FIG. 7E (contacting cap 760 which is in electrical contact with n-region 706 of transistor 704 through conductor 756)). The signal is interpreted to provide an indication of current flowing in the transistor 704 during operation, from which the operating parameters of the transistor 704 can be determined. Either current or voltage can be measured. Alternatively, in step 624, a voltage can be applied through conductor 756 or a current injected into the hole to turn transistor 704 on or off, or to change the characteristics of the transistor 702 while it is operating. While the procedure described above provides access to the n-region 706, the hole 742 could be milled to provide access to any active region, such as the other n-region 706 or with either p+ region 716.

While the embodiment of FIGS. 6 and 7A-7E was performed on a CMOS transistor on a flip-chip, the invention is not limited to any particular type of circuit or substrate. Embodiments of the invention can readily be adapted, for example, to other chips employing other types of packaging, NMOS, PMOS, bipolar, and other types of circuit, including circuits implemented using semiconductor-on-insulator (SOI) technology.

Thus, the invention can be applied in the semiconductor laboratory to make direct electrical contact to doped regions of silicon. This technique allows connection to the source and drain of a transistor from the backside of the integrated circuit, while allowing the product to continue operating normally under test conditions. The electrical connection to the source can allow direct control of drive current and shift the switch timing of a specific circuit. Direct connection to the drain allows for measurement of the switching time and drive current of the transistor.

In any of the embodiments above, the deposition can be monitored as the process progresses by observing the voltage or current values, such as on a semiconductor parameter analyzer, chart recorder, or even a multimeter. For example, the current provides an indication of the rate of deposition. By integrating the current over time to determine the total charge that has passed through the circuit, the amount of material that has been deposited can be estimated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of providing a microscopic electrically conductive structure, comprising:
   directing a focused beam toward a substrate surface in the absence of a deposition precursor gas to produce a conductive seed pattern by embedding ions into the substrate to increase the conductivity of the pattern;
   covering at least a portion of the conductive seed pattern with an electrolyte; and
   providing an electric current though the electrolyte to the conductive pattern to deposit a conductive material on the conductive seed pattern.

2. The method of claim 1 in which directing a focused beam toward a substrate surface includes directing a focused beam of dopant ions into a semiconducting substrate to implant dopant atoms particles into the substrate surface.

3. The method of claim 2 in which directing a focused beam toward a substrate surface includes directing a beam of ions from the group consisting of the $3^{rd}$ or $5^{th}$ column of the periodic table and in which the substrate is composed of material from the group consisting of the $4^{th}$ column of the periodic table.

4. The method of claim 2 in which directing a focused beam towards the substrate surface includes directing a focused beam toward a lower conductivity layer covering a higher conductivity layer, the higher conductivity layer having sufficient conductivity to support an electrodeposition reaction and the lower conductivity layer having insufficient conductivity to support an electrodeposition reaction, the focused beam exposing at least a portion of the higher conductivity layer to support an electrodeposition reaction at positions impacted by the beam.

5. The method of claim 4 in which directing a focused beam toward a lower conductivity layer covering a higher conductivity layer includes directing a focused ion beam toward an oxide layer over a doped semiconductor silicon layer.

6. The method of claim 4 in which directing a focused beam toward a lower conductivity layer covering a higher conductivity layer includes directing a laser beam or an electron beam toward the lower conductivity layer.

7. The method of claim 4 further comprising growing or depositing the lower conductivity layer onto the substrate.

8. The method of claim 1 in which directing a focused beam toward a substrate surface in the absence of a deposition precursor gas to produce a conductive seed pattern includes removing a structure in a substrate.

9. The method of claim 1 in which directing a focused beam toward a substrate surface includes directing a charged particle beam in a two dimensional pattern.

10. The method of claim 1 in which directing a focused beam toward a substrate surface includes directing a charged particle beam to remove or add a three-dimensional structure.

11. The method of claim 1 further comprising etching the substrate to free the conductive material.

12. The method of claim 1 further comprising monitoring the electric current to determine the deposition rate or amount of conductive material on the conductive seed pattern.

13. A method of providing a microscopic electrically conductive structure, comprising:
   directing ions or atoms toward a substrate in the absence of a precursor gas to produce patterned regions of increased conductivity including:
      applying a photoresist layer over a substrate;
      exposing the photoresist;
      developing the photoresist to leave a pattern of exposed substrate surface;
      after developing the photoresist, exposing exposed areas of the substrate to ion or atom flux; and
      removing remaining photoresist; and
   electro-chemical deposition of a metallic material over the patterned regions of increased conductivity.

14. The method of claim 13 further comprising monitoring an electric current or voltage during electrodepositing to determine the deposition rate or deposition of the electroplating.

15. The method of claim 13 in which exposing exposed areas of the substrate to ion or atom flux includes increasing the conductivity of the exposed substrate surface by implanting dopant ions or atoms.

16. The method of claim 13 in which exposing exposed areas of the substrate to ions or atom flux includes increasing the conductivity of the exposed substrate surface by removing a low conductivity layer.

17. A method of producing a microscopic metallic structure, comprising:
   directing a focused beam to a substrate to form a conductive pattern by embedding ions;
   electrodepositing a metallic material onto the conductive pattern to form the microscopic metallic structure; and
   freeing the microscopic metallic structure from the substrate.

18. The method of claim 17 in which freeing the microscopic metallic structure from the substrate includes etching the substrate under the microscopic metallic structure.

19. The method of claim 17 in which forming a conductive pattern includes depositing a metallic material and in which freeing the microscopic metallic structure from the substrate includes etching the metallic material.

20. The method of claim 19 in which formation a conductive pattern includes depositing a metallic material.

* * * * *